United States Patent [19]

Hager

[11] Patent Number: 4,683,105

[45] Date of Patent: Jul. 28, 1987

[54] TESTABLE, FAULT-TOLERANT POWER INTERFACE CIRCUIT FOR NORMALLY DE-ENERGIZED LOADS

[75] Inventor: Robert E. Hager, Pittsburgh, Pa.

[73] Assignee: Westinghouse Electric Corp., Pittsburgh, Pa.

[21] Appl. No.: 793,381

[22] Filed: Oct. 31, 1985

[51] Int. Cl.$^4$ ............................................. G21C 17/00
[52] U.S. Cl. ...................................... 376/259; 376/215; 324/415; 371/20; 371/22; 371/36
[58] Field of Search .............. 376/215, 216, 217, 245, 376/259; 324/415; 371/20, 22, 36; 340/664

[56] References Cited

U.S. PATENT DOCUMENTS

| | | | |
|---|---|---|---|
| 3,437,556 | 4/1969 | Bevilaqua et al. | 376/259 |
| 3,967,257 | 6/1976 | Hager | 340/664 |
| 4,184,514 | 1/1980 | Ryan et al. | 376/215 |
| 4,200,864 | 4/1980 | Gillet et al. | 376/215 |
| 4,272,725 | 6/1981 | Weiner et al. | 324/415 |
| 4,317,412 | 3/1982 | Bolcavage et al. | 324/415 |
| 4,320,508 | 3/1982 | Takezoe | 371/22 |
| 4,422,140 | 12/1983 | Keats | 371/20 |
| 4,427,620 | 1/1984 | Cook | 376/216 |
| 4,434,132 | 2/1984 | Cook | 376/215 |
| 4,562,035 | 12/1985 | Plaige | 376/215 |
| 4,587,077 | 5/1986 | Bessedine | 376/215 |

Primary Examiner—Salvatore Cangialosi
Attorney, Agent, or Firm—Daniel C. Abel

[57] ABSTRACT

A power interface circuit for normally deenergized loads includes the capability to test the operation and connections thereof without any possibility of accidental activation of the load. Three input signals may be received by the power interface circuit which supplies power to a load if two out of three of the input signals indicates activation of the load. A normally closed switch which ordinarily provides power directly to the voter is opened during testing so that the voter is supplied with a reduced power that is insufficient to activate the load. The normally closed switch is closed if any of the input signals indicate activation of the load. Current sensors are included in the power interface circuit to detect all possible logic combinations for activating the load and to detect the operation of the normally closed switch.

12 Claims, 2 Drawing Figures

TESTABLE, FAULT-TOLERANT POWER INTERFACE CIRCUIT FOR NORMALLY DE-ENERGIZED LOADS

CROSS REFERRENCE TO RELATED APPLICATIONS

This application is related to the following copending U.S. patent application, assigned to the assignee of the present invention: Miller and Sutherland, "Auxiliary Reactor Protection System", having Westinghouse Ser. No. 732,325, filed May 9, 1985.

Commonly owned U.S. patent application entitled "Voted Logic Power Circuit and Method of Operating Same" filed concurrently herewith in the names of Bruce M. Cook and Jerzy Gutman and identified as U.S. patent application Ser. No. 793,383.

My commonly owned U.S. patent application entitled "Testable Voted Logic Power Interface" filed concurrently herewith and identified by U.S. patent application Ser. No. 793,382.

Commonly owned U.S. patent application entitled "Self-Compensating Voted Logic Power Interface with Tester" filed concurrently herewith in the name of Henry F. Cook and identified by U.S. patent application Ser. No. 793,422.

BACKGROUND OF THE INVENTION

1. Field of the Invention

The present invention relates in general to a power interface circuit which controls the supply of power from a power supply to plant process equipment which is normally de-energized, and more specifically to a power interface circuit which controls pumps, valves, etc. in a pressurized light water nuclear power system.

2. Description of the Related Art

Plant process equipment, such as the equipment in a nuclear power system is conventionally controlled by redundant actuation circuits which receive input signals from redundant sensors. An example of a conventional two out of four voting power interface circuit for both normally energized and de-energized circuits is illustrated in FIG. 1. An example of how such redundant circuits can be used for two out of three voting is described in U.S. Pat. No. 4,200,864 issued to Gillet et al. In Gillet et al., two out of three voting is performed using relays; however, two out of three voting is also possible with valves, as described in U.S. Pat. No. 4,184,514 issued to Ryan et al.

In addition to the redundancy provided by conventional control circuits for critical plant processing equipment, such control circuits are conventionally designed to be testable to further improve their reliability. Usually, such testing requires the manual intervention of an operator with the result that the test of a single logic circuit necessitates several hours according to Gillet et al. Elimination of such operator controlled testing has been suggested for units such as line printers, see U.S. Pat. No. 4,317,412 issued to Bolcavage et al., and communication networks, see U.S. Pat. No. 4,320,508 to Takezoe. However, with respect to power interface circuits for plant process equipment, conventional systems are limited to self-testing of the status of contacts as described in U.S. Pat. No. 4,272,725 issued to Weiner et al. and do not include testing the circuit operation.

At least two problems must be overcome in order to produce power interface circuits which include automatic testing capabilities. The first problem area involves the complexity of redundant circuits. In order to replace the manual operations described in Gillet et al., complex automatic testing has been suggested, such as the multiplexer testing described in U.S. Pat. No. 4,422,140 issued to Keats.

The second problem area involves a conflict between testing the operation of an actuator and preventing inadvertent actuation of the device controlled by the actuator. Many of the systems in a nuclear power system are of the "fail-safe" type which are designed to be operated only in an emergency situation when another (independent) system fails to operate properly. Such "fail-safe" systems are required to be highly reliable and therefore, are preferrably testable. However, inadvertant actuation of such systems may cause partial or total shutdown of the nuclear reactor and require a re-start period of as much as several weeks or more. The conventional test circuit disclosed in U.S. Pat. No. 3,437,556 to Bevilacqua et al. is an example of a conventional system which uses relays and has to compromise between full testing of the system and the prevention of inadvertant actuations.

SUMMARY OF THE INVENTION

An object of the present invention is to provide a fault-tolerant power interface circuit which permits automatic testing without actuation of a normally de-energized process control apparatus controlled by the power interface circuit.

Another object of the present invention is to provide a fault-tolerant power interface circuit which permits automatic testing that does not affect the ability of the circuit to control a process control apparatus in response to input signals.

Yet another object of the present invention is to provide a fault-tolerant power interface circuit which includes a minimum number of current sensors for testing the ability of the circuit to control a process control apparatus connnected to the power interface circuit.

Still another object of the present invention is to provide a two of n voting power interface circuit which can be tested for each possible signal combination without actuation of a de-energized load controlled by a relay or a power semiconductor.

A further object of the present invention is to provide a testable fault tolerant power interface circuit which can use sensors which detect a change in current or current level.

The above mentioned objects are obtained by providing a power interface circuit for providing power to a normally de-energized load including a voter which receives n input signals and generates a control signal using switches when at least m input signals indicate that the control signal should be generated. The voter also receives two times n independent signals corresponding to the n input signals for testing the voter. The power interface circuit also includes direct power means for supplying power to the switches when the voter is not being tested or when any of the n input signals are generated. For testing, the power interface circuit includes reduced power means for supplying the switches with a reduced power, less than the power required to activate the load, and a current sensor for sensing the current supplied by the reduced power means.

These objects, together with other objects and advantages which will be subsequently apparent, reside in the details of construction and operation as more fully hereinafter described and claimed, reference being had to the accompanying drawings forming a part hereof, wherein like reference numerals refer to like parts throughout.

DESCRIPTION OF THE PREFERRED EMBODIMENT

Figure 1:
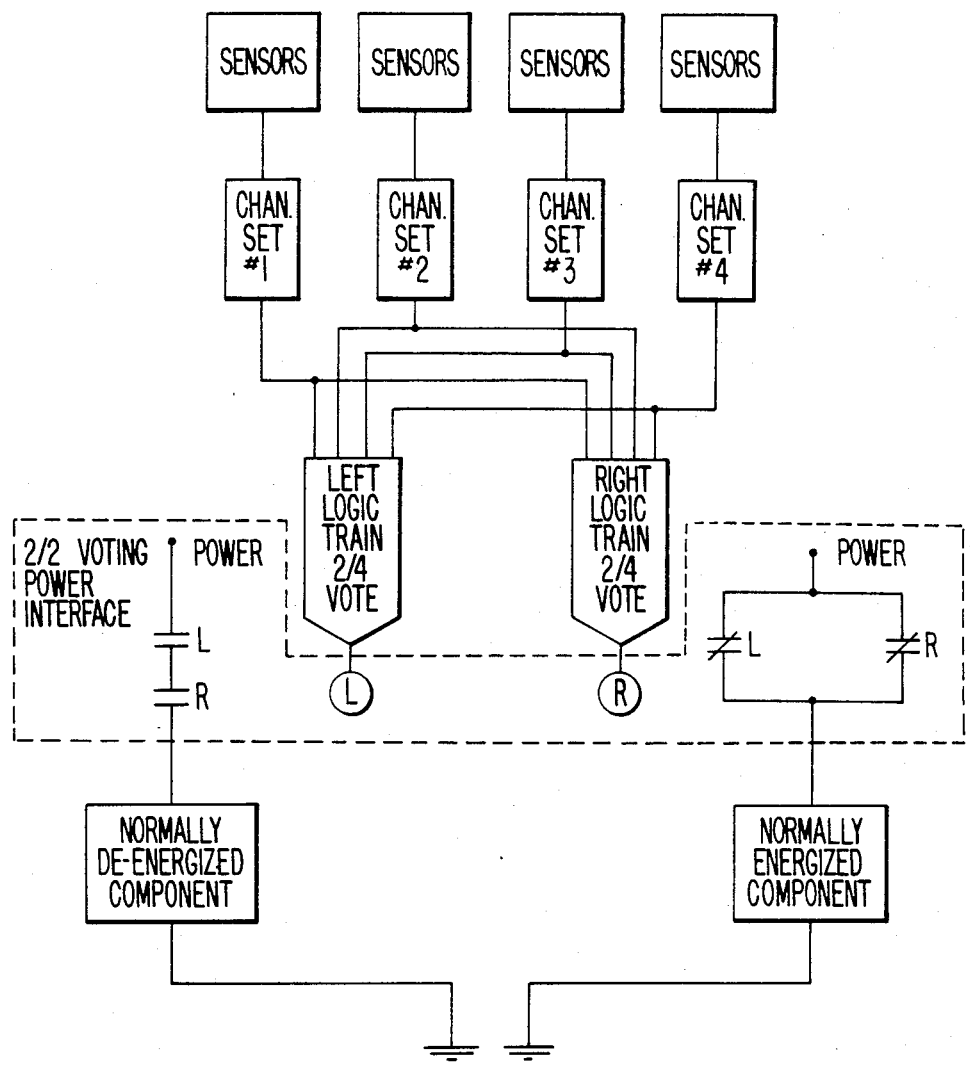
FIG. 1 is a block diagram of a conventional two out of four voting power interface for both normally energized and de-energized loads.
Figure 2:
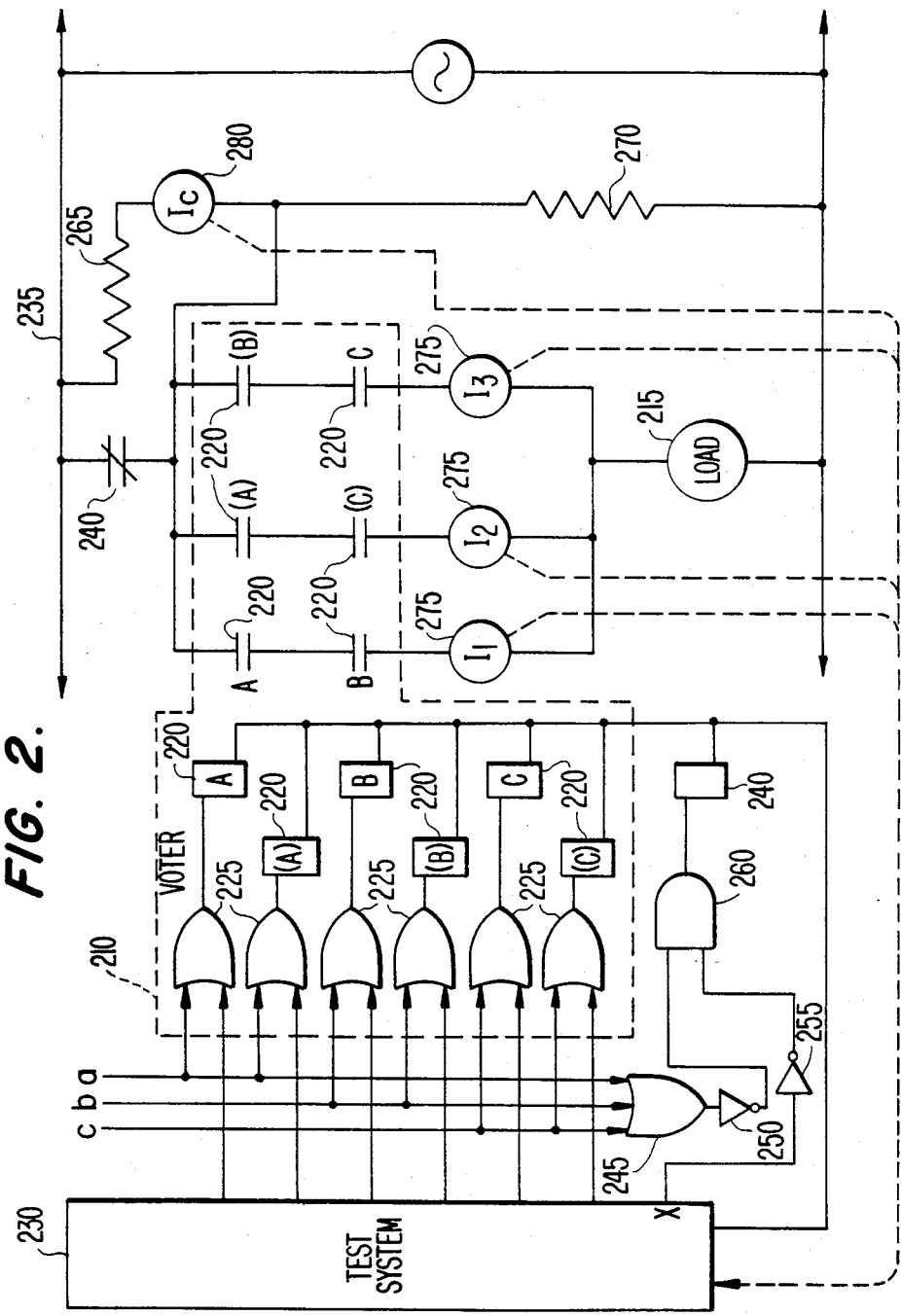
FIG. 2 is a block diagram of an embodiment of the present invention.

An embodiment of the present invention is illustrated in FIG. 2. A two out of three voter 210 receives three input signals a, b and c, any two of which will cause the voter 210 to actuate the load 215. In the embodiment of FIG. 2, the logic signal connections are indicated on the left for switches 220, such as relays or power semiconductors, while the power connections are illustrated on the right. An example of a relay which can be used in a 5 volt system is a JRE1DA15 from Potter & Brumfield.

The logic and power connections for the switches 220 are illustrated separately because the logic and power signals are conventionally electrically isolated. There are many ways to provide such isolation including using logic gates or an appropriately programmed microprocessor to perform the logical operations indicated by the connections of the switches 220 and one or more power semiconductors, connected to the logic gates via opto-isolators, to supply power to the load.

The switches 220 are illustrated with a capital letter, e.g., A or (A), indicating a corresponding input signal, e.g., a, to which they respond by closing. That is, they are normally open switches. The switches 220 are activated by signals output by OR gates 225 which receive the input signals a, b and c and test signals from a microprocessor test system 230, such as an 88/40 single board computer manufactured by INTEL. The switches 220 are ordinarily supplied with power from a power line 235 via a direct supply means 240 comprising a normally closed switch.

When the power interface circuit is to be tested, the test system 230 changes a switch signal X from its normal logic "1" signal to a logic "0" signal. The output of OR gate 245 will be logic "0" as long as all of the input signals a, b, and c, supply a value of logic "0" which indicates non-activation of the switches 220. Therefore, the output of inverter 250 will be logic "1". During testing, when the switch signal X is inverted by inverter 255, the output of the AND gate 260 will change from logic "0" to "1". Thus, the normally closed switch 240 will be opened during testing unless one of the input signals a, b or c indicate activation of the load 215.

When the switch 240 is opened, the switches 220 are supplied with power via a reduced power means comprising resistors 265 and 270. The values of resistors 265 and 270 are chosen so that when any of the pairs of switches 220 are activated by test signals from the test system 230, the current which is supplied to the load 215 is insufficient to activate the load. For example, when using JRE1DA15 relays, resistors 265 and 270 may be 10 and 50 kilohms, respectively. Thus, it is possible to test each of the pairs of switches 220 using current sensors 275 which may be linear current sensors, such as CSLA8P1's manufactured by Minneapolis Honeywell, Micro-switch Division.

It would be possible to test the switches 220 using a power interface circuit which does not include resistor 270; however, resistor 270 is included so that a small current flows through a current detector 280 (which also may be a CLSA8P1) when all of switches 220 and 240 are open. The inclusion of current detector 280 and resistor 270 enable the testing of the condition of switch 240 to ensure that the switch 240 is opened at the commencement of testing so the load 215 will not be accidentally activated during testing, and that the switch 240 is closed after testing is completed.

It is also possible to test the power interface circuit without the use of current sensors 275, provided current sensor 280 is included and has sufficient sensitivity. This process will be explained with reference to TABLE 1, below. When switch 240 is closed, current detector 280 is shunted with a short circuit so that the current detected by current detector 280 is zero (0) volts. When all of switches 220 and 240 are opened, the current detected by current detector 280 will assume an intermediate value (I) due to current flow through resistors 265 and 270. When switch 240 is open and at least one of the pairs of switches 220, i.e., A and B, (A) and (C), or (B) and C, are closed, the current detected by current detector 280 will be a high value (H) due to the shunting of resistor 270 by the pair of closed switches 220 and the load 215 which will have a much lower resistance than resistor 270. If at any time, the indicated results are not obtained as outputs, the test is aborted to prevent accidential activation of the load.

TABLE 1

| STEP | TEST SEQUENCE INPUTS | | | | | | | OUTPUTS | | | |
|---|---|---|---|---|---|---|---|---|---|---|---|
| | A | (A) | B | (B) | C | (C) | X | $I_1$ | $I_2$ | $I_3$ | $I_c$ |
| 1 | 0 | 0 | 0 | 0 | 0 | 0 | 1 | 0 | 0 | 0 | 0 |
| 2 | 0 | 0 | 0 | 0 | 0 | 0 | 0 | 0 | 0 | 0 | I |
| 3 | 1 | 0 | 0 | 0 | 0 | 0 | 0 | 0 | 0 | 0 | I |
| 4 | 0 | 1 | 0 | 0 | 0 | 0 | 0 | 0 | 0 | 0 | I |
| 5 | 0 | 0 | 1 | 0 | 0 | 0 | 0 | 0 | 0 | 0 | I |
| 6 | 0 | 0 | 0 | 1 | 0 | 0 | 0 | 0 | 0 | 0 | I |
| 7 | 0 | 0 | 0 | 0 | 1 | 0 | 0 | 0 | 0 | 0 | I |
| 8 | 0 | 0 | 0 | 0 | 0 | 1 | 0 | 0 | 0 | 0 | I |
| 9 | 1 | 0 | 1 | 0 | 0 | 0 | 0 | 1 | 0 | 0 | H |
| 10 | 0 | 1 | 0 | 0 | 0 | 1 | 0 | 0 | 1 | 0 | H |
| 11 | 0 | 0 | 0 | 1 | 1 | 0 | 0 | 0 | 0 | 1 | H |
| 12 | 0 | 0 | 0 | 0 | 0 | 0 | 0 | 0 | 0 | 0 | I |
| 13 | 0 | 0 | 0 | 0 | 0 | 0 | 1 | 0 | 0 | 0 | 0 |

As illustrated in FIG. 2, the currents detected by current detectors 275 and 280 are supplied to the test system 230, so that the tests illustrated in TABLE 1 can be performed. If all four of the current detectors 275 and 280 are included, it is possible to verify that the current detectors are operating properly since the level indicated by the current detector 280 provides redundant test result information confirming the test results of the currents indicated by current detectors 275. While FIG. 2 illustrates a two out of three voting power interface circuit, the basic design of will work for any two out of n voting power interface circuit.

The many features and advantages of the present invention are apparent from the detailed specification, and thus it is intended by the appended claims to cover all such features and advantages of the circuit which fall within the true spirit and scope of the invention. Further, since numerous modifications and changes will readily occur to those skilled in the art, it is not desired to limit the invention to the exact construction and operation illustrated and described, accordingly, all suitable modifications and equivalents may be resorted to, falling within the scope and spirit of the invention.

What is claimed is:

1. A power interface circuit for providing power to a load from a power line when at least m out of n input signals indicate that the load should be activated, comprising:
   voter means for supplying power to the load from the power line when at least m of the n input signals indicate activation;
   direct power means for supplying power directly to said voter means from the power line during ordinary operation of said voter means;
   reduced power means for supplying a reduced power from the power line to said voter means in place of said direct power means when said voter means is being tested and all of the n input signals indicate normal operation; said reduced power being less than the power required to activate the load; and
   current sensor means, operatively connected between said voter means and the load, for sensing current flowing through said voter means.

2. A power interface circuit as recited in claim 1, wherein said reduced power means comprises a first resistor operatively connected between the power line and said voter means.

3. A power interface circuit as recited in claim 2,
   wherein said reduced power means further comprises a second resistor operatively connected between said voter means and ground, and in series with the first resistor between the power line and ground, and
   wherein said power interface circuit further comprises a current detector operatively connected in series with said first and second resistors between the first resistor and said voter means.

4. A power interface circuit as recited in claim 1,
   wherein m equals two and said voter means comprises n pairs of switches, the pairs of switches operatively connected in parallel between said direct and reduced power means and the load, and
   wherein said current sensor means comprises n output current detectors, each operatively connected to one of the pairs of switches and the load.

5. A power interface circuit as recited in claim 4, further comprising an input current detector operatively connected to said reduced power means and said voter means.

6. A power interface circuit as recited in claim 1, further comprising a current detector operatively connected to said reduced power means and said voter means.

7. A power interface circuit as recited in claim 1, further comprising a microprocessor test system, operatively connected to said voter means, said direct power means and said current sensor means, for automatically testing said voter means, after causing said direct power means to stop supplying power to said voter means, by generating test signals for said voter means and then causing said direct power means to supply power to said voter means when testing is completed.

8. A power interface circuit for providing power to a load from a power line when at least m out of n input signals indicate that the load should be activated, comprising:
   voter means for supplying power to the load from the power when at least m of the n input signals indicate activation;
   direct power means for supplying power directly to said voter means and load from the power line during ordinary operation of said voter means;
   reduced power means for supplying a reduced power from the power line to said voter means and load in place of said direct power means when said voter means is being tested and all of the n input signals indicate normal operation, said reduced power being less than the power required to operate said load; and
   current sensor means, operatively connected to said reduced power means and said voter means, for sensing current flowing through said reduced power means.

9. A power interface circuit as recited in claim 8, further comprising a microprocessor test system, operatively connected to said voter means, said direct power means and said current sensor means, for automatically testing said voter means, after causing said direct power means to stop supplying power to said voter means, by generating test signals for said voter means and then causing said direct power means to supply power to said voter means when testing is completed.

10. A power interface circuit for supplying power from a power line to a normally de-energized process control apparatus in a pressurized light water nuclear power system in dependence upon three input signals, comprising:
    voter means for supplying power to the normally de-energized load when at least two of the three input signals indicates that the normally de-energized load should be activated;
    a normally closed switch, operatively connected to the power line and said voter means, for supplying power to said voter means during ordinary operation;
    a first resistor operatively connected to the power line;
    a current detector operatively connected to said first resistor and said voter means;
    a second resistor operatively connected to said current detector and ground; and
    current sensor means, operatively connected between said voter means and the normally de-energized load, for detecting the power supplied to the normally de-energized load by said voter means.

11. A power interface circuit as recited in claim 10, further comprising a microprocessor test system, operatively connected to said voter means, said normally closed switch, said current detector and said current sensor means, for automatically testing said voter means, after opening said normally closed switch, by generating test signals for said voter means and then closing said normally closed switch to supply power to said voter means when testing is completed.

12. A power interface circuit as recited in claim 11 further comprising gate means operatively connected to said input signals, said test system and said normally closed switch for overriding said test system and closing said normally closed switch during automatic testing when one of said input signals indicates that said normally deenergized load should be activated.

* * * * *